United States Patent
Yamane et al.

(10) Patent No.: US 12,218,266 B2
(45) Date of Patent: Feb. 4, 2025

(54) PHOTODETECTION ELEMENT, RECEIVING DEVICE, AND OPTICAL SENSOR DEVICE

(71) Applicant: TDK CORPORATION, Tokyo (JP)

(72) Inventors: Takekazu Yamane, Tokyo (JP); Tomohito Mizuno, Tokyo (JP)

(73) Assignee: TDK CORPORATION, Tokyo (JP)

( * ) Notice: Subject to any disclaimer, the term of this patent is extended or adjusted under 35 U.S.C. 154(b) by 414 days.

(21) Appl. No.: 17/576,467

(22) Filed: Jan. 14, 2022

(65) Prior Publication Data
US 2022/0231181 A1    Jul. 21, 2022

(30) Foreign Application Priority Data

Jan. 18, 2021 (JP) .................................. 2021-005590
Oct. 12, 2021 (JP) .................................. 2021-167503

(51) Int. Cl.
*H01L 31/09* (2006.01)
*H10N 50/10* (2023.01)

(52) U.S. Cl.
CPC ............. *H01L 31/09* (2013.01); *H10N 50/10* (2023.02)

(58) Field of Classification Search
CPC ............. H01L 31/09; H01L 27/14634; H01L 27/1464; H01L 27/14601; H10N 50/10; G01J 3/0208; G01J 2003/516; G01J 1/42; G01J 3/513; G01D 5/26
USPC ........................................................ 257/431
See application file for complete search history.

(56) References Cited

U.S. PATENT DOCUMENTS

| | | | | |
|---|---|---|---|---|
| 6,714,390 B2 * | 3/2004 | Terada | ................... | G11C 11/161 257/E27.005 |
| 6,925,261 B2 | 8/2005 | Haruyama | | |
| 7,077,936 B2 * | 7/2006 | Saito | ................... | H01F 10/3218 360/324.11 |
| 7,092,222 B2 * | 8/2006 | Hasegawa | ............... | B82Y 25/00 360/324.11 |
| 7,476,954 B2 * | 1/2009 | Wang | ...................... | B82Y 25/00 365/158 |

(Continued)

FOREIGN PATENT DOCUMENTS

| | | |
|---|---|---|
| CN | 101236096 A | 8/2008 |
| JP | 2001-292107 A | 10/2001 |

OTHER PUBLICATIONS

Chen et al.; "All-Optical Switching of Magnetic Tunnel Junctions with Single Subpicosecond Laser Pulses;" Physical Review Applied; 2017; pp. 021001-1-021001-6; vol. 7.

(Continued)

*Primary Examiner* — Vu A Vu
(74) *Attorney, Agent, or Firm* — Oliff PLC

(57) ABSTRACT

A photodetection element includes a magnetic element including a first ferromagnetic layer to which light is applied, a second ferromagnetic layer, and a spacer layer sandwiched between the first ferromagnetic layer and the second ferromagnetic layer; a first electrode in contact with a first surface of the magnetic element, the first surface being located on a first ferromagnetic layer side of the magnetic element in a lamination direction; a second electrode in contact with a second surface of the magnetic element, the second surface being opposite to the first surface; and a first high thermal conductivity layer disposed outside of the first ferromagnetic layer and having higher thermal conductivity than the first electrode.

17 Claims, 8 Drawing Sheets

(56) References Cited

U.S. PATENT DOCUMENTS

| | | |
|---|---|---|
| 9,842,874 B2 | 12/2017 | Nakata |
| 10,396,276 B2 * | 8/2019 | Sasaki ................. G11C 11/1653 |
| 11,538,856 B2 * | 12/2022 | Dixit ..................... H10N 50/80 |
| 2001/0040713 A1 | 11/2001 | Haruyama |
| 2003/0179510 A1 * | 9/2003 | Hayakawa ........... G11B 5/3903 |
| | | 365/158 |

OTHER PUBLICATIONS

Translation of Oct. 21, 2024 Office Action issued in Chinese Application No. 202210036932.6.

* cited by examiner

PHOTODETECTION ELEMENT, RECEIVING DEVICE, AND OPTICAL SENSOR DEVICE

CROSS-REFERENCE TO RELATED APPLICATION

Priority is claimed on Japanese Patent Application No. 2021-005590, filed Jan. 18, 2021 and Japanese Patent Application No. 2021-167503, filed Oct. 12, 2021, the content of which is incorporated herein by reference.

BACKGROUND

The present disclosure relates to a photodetection element, a receiving device, and an optical sensor device.

Photoelectric conversion elements are used for various purposes.

For example, Patent Document 1 describes a receiving device that receives an optical signal using a photodiode. The photodiode is, for example, a pn junction diode using a semiconductor pn junction or the like, and converts light into an electrical signal.

For example, in Patent Document 2, an optical sensor using a semiconductor pn junction and an image sensor using the optical sensor are disclosed.

PATENT DOCUMENTS

[Patent Document 1] Japanese Unexamined Patent Application, First Publication No. 2001-292107
[Patent Document 2] U.S. Pat. No. 9,842,874

SUMMARY

Although photodetection elements using semiconductor pn junctions are widely used, new photodetection elements are required for further development. Also, a photodetection element often generates heat that adversely affects an element and a circuit when light is applied and improvement in heat dissipation is required.

It is desirable to provide a photodetection element, a receiving device, and an optical sensor device having excellent heat dissipation.

The following means is provided.

According to a first aspect, there is provided a photodetection element including: a magnetic element including a first ferromagnetic layer to which light is applied, a second ferromagnetic layer, and a spacer layer sandwiched between the first ferromagnetic layer and the second ferromagnetic layer; a first electrode in contact with a first surface of the magnetic element, the first surface being located on a first ferromagnetic layer side of the magnetic element in a lamination direction; a second electrode in contact with a second surface of the magnetic element, the second surface being opposite to the first surface; and a first high thermal conductivity layer disposed outside of the first ferromagnetic layer and having higher thermal conductivity than the first electrode.

According to a second aspect, there is provided a photodetection element including: a magnetic element including a first ferromagnetic layer to which light is applied, a second ferromagnetic layer, and a spacer layer sandwiched between the first ferromagnetic layer and the second ferromagnetic layer; and a first high thermal conductivity layer disposed outside of the first ferromagnetic layer and being a nonmagnetic metal.

According to a third aspect, there is provided a receiving device including: the photodetection element according to the above-described aspect.

According to a fourth aspect, there is provided an optical sensor device including: the photodetection element according to the above-described aspect.

The photodetection element, the receiving device, and the optical sensor device according to the above-described aspects have excellent heat dissipation.

DETAILED DESCRIPTION

Figure 1:
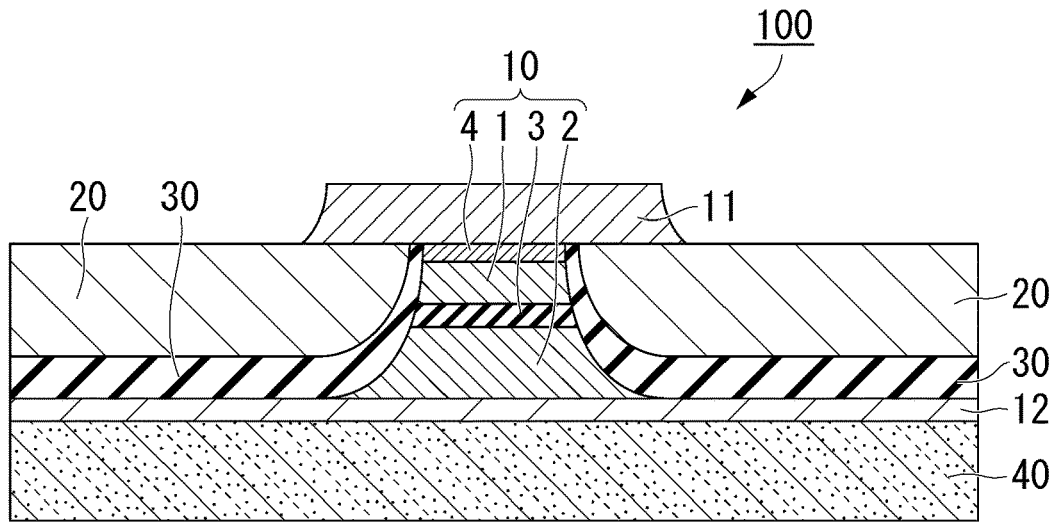
FIG. 1 is a cross-sectional view of a photodetection element according to a first embodiment.

Hereinafter, the present embodiment will be described in detail with reference to the drawings as appropriate. In the drawings used in the following description, featured parts may be enlarged parts for convenience so that the features of the present disclosure are easier to understand, and dimensional ratios and the like of the respective components may be different from actual ones. Materials, dimensions, and the like exemplified in the following description are examples, the present disclosure is not limited thereto, and modifications can be appropriately made in a range in which advantageous effects of the present disclosure are exhibited.

Directions will be defined. A lamination direction of a magnetic element 10 is defined as a z direction, one direction within a plane orthogonal to the z direction is defined as an x direction, and a direction orthogonal to the x direction and the z direction is defined as a y direction. The z direction is an example of the lamination direction. Hereinafter, a +z direction may be expressed as an "upward" direction and a −z direction may be expressed as a "downward" direction. The +z direction is a direction from a second ferromagnetic layer 2 to a first ferromagnetic layer 1. The upward and downward directions do not always coincide with a direction in which gravity is applied.

FIG. 1 is a cross-sectional view of a photodetection element 100 according to the first embodiment. The photodetection element 100 replaces a change in a state of applied light with an electrical signal. A resistance value of the photodetection element 100 in the z direction changes with the state of the applied light. An output voltage from the photodetection element 100 changes with the state of the applied light. The light in the present specification is not limited to visible light and also includes infrared light having a wavelength longer than that of the visible light and ultraviolet light having a wavelength shorter than that of the visible light. The wavelength of the visible light is, for example, 380 nm or more and less than 800 nm. The wavelength of the infrared light is, for example, 800 nm or more and 1 mm or less. The wavelength of the ultraviolet light is, for example, 200 nm or more and less than 380 nm.

The photodetection element 100 includes, for example, the magnetic element 10, a first electrode 11, a second electrode 12, a first high thermal conductivity layer 20, an insulating layer 30, and a substrate 40.

The magnetic element 10 has, for example, the first ferromagnetic layer 1, the second ferromagnetic layer 2, a spacer layer 3, and a cap layer 4. The spacer layer 3 is located between the first ferromagnetic layer 1 and the second ferromagnetic layer 2. The cap layer 4 covers an upper surface of the magnetic element 10 in the lamination direction. The cap layer 4 is, for example, on the first ferromagnetic layer 1. The magnetic element 10 may have other layers in addition to these.

The magnetic element 10 is, for example, a magnetic tunnel junction (MTJ) element in which the spacer layer 3 is made of an insulating material. In this case, in the magnetic element 10, a resistance value in the z direction (a resistance value when a current flows in the z direction) changes in accordance with a relative change between a state of magnetization of the first ferromagnetic layer 1 and a state of magnetization of the second ferromagnetic layer 2. Such an element is also called a magnetoresistance effect element.

The first ferromagnetic layer 1 is a photodetection layer whose magnetization state changes when light is applied thereto from the outside. The first ferromagnetic layer 1 is also called a magnetization free layer. The magnetization free layer is a layer including a magnet whose magnetization state changes when a prescribed external force has been applied. The prescribed external force is, for example, light which is applied from the outside, a current flowing in the z direction of the magnetic element 10, or an external magnetic field. The state of the magnetization of the first ferromagnetic layer 1 changes with an intensity of light that is applied to the first ferromagnetic layer 1.

The first ferromagnetic layer 1 includes a ferromagnet. The first ferromagnetic layer 1 includes at least one of magnetic elements such as Co, Fe, and Ni. The first ferromagnetic layer 1 may include nonmagnetic elements such as B, Mg, Hf, and Gd in addition to the above-described magnetic elements. The first ferromagnetic layer 1 may be, for example, an alloy including a magnetic element and a nonmagnetic element. The first ferromagnetic layer 1 may include a plurality of layers. The first ferromagnetic layer 1 is, for example, a CoFeB alloy, a laminate in which a CoFeB alloy layer is sandwiched between Fe layers, and a laminate in which a CoFeB alloy layer is sandwiched between CoFe layers.

The first ferromagnetic layer 1 may be an in-plane magnetization film having an axis of easy magnetization in a direction within a film surface (any direction within the xy plane) or may be a perpendicular magnetization film having an axis of easy magnetization in a direction (the z direction) perpendicular to the film surface.

A thickness of the first ferromagnetic layer 1 is, for example, 1 nm or more and 5 nm or less. The thickness of the first ferromagnetic layer 1 may be, for example, 1 nm or more and 2 nm or less. If the thickness of the first ferromagnetic layer 1 is thin when the first ferromagnetic layer 1 is a perpendicular magnetization film, the effect of applying perpendicular magnetic anisotropy from the layers above and below the first ferromagnetic layer 1 is strengthened and perpendicular magnetic anisotropy of the first ferromagnetic layer 1 increases. That is, when the perpendicular magnetic anisotropy of the first ferromagnetic layer 1 is high, a force for the magnetization M1 to return in the z direction is strengthened. On the other hand, when the thickness of the first ferromagnetic layer 1 is thick, the effect of applying the perpendicular magnetic anisotropy from the layers above and below the first ferromagnetic layer 1 is relatively weakened and the perpendicular magnetic anisotropy of the first ferromagnetic layer 1 is weakened.

The volume of a ferromagnet becomes small when the thickness of the first ferromagnetic layer 1 becomes thin. The volume of a ferromagnet becomes large when the thickness of the first ferromagnetic layer 1 becomes thick. The susceptibility of the magnetization of the first ferromagnetic layer 1 when external energy has been applied is inversely proportional to a product (KuV) of the magnetic anisotropy (Ku) and the volume (V) of the first ferromagnetic layer 1. That is, when the product of the magnetic anisotropy and the volume of the first ferromagnetic layer 1 becomes small, the reactivity to light increases. From this point of view, the magnetic anisotropy of the first ferromagnetic layer 1 may be appropriately designed and then the volume of the first ferromagnetic layer 1 may be reduced so that the reaction to light increases.

When the thickness of the first ferromagnetic layer 1 is thicker than 2 nm, an insertion layer made of, for example, Mo and W may be provided within the first ferromagnetic layer 1. That is, the first ferromagnetic layer 1 may be a laminate in which the ferromagnetic layer, the insertion layer, and the ferromagnetic layer are laminated in that order in the z direction. Interfacial magnetic anisotropy at an interface between the insertion layer and the ferromagnetic layer enhances the perpendicular magnetic anisotropy of the entire first ferromagnetic layer 1. A thickness of the insertion layer is, for example, 0.1 nm to 0.6 nm.

The second ferromagnetic layer 2 is a magnetization fixed layer. The magnetization fixed layer is a layer made of a magnet whose magnetization state is less likely to change than that of the magnetization free layer when prescribed external energy has been applied. For example, in the magnetization fixed layer, a direction of magnetization is less likely to change than that in the magnetization free layer when prescribed external energy has been applied. Also, for example, in the magnetization fixed layer, a magnitude of magnetization is less likely to change than that in the magnetization free layer when prescribed external energy is applied. For example, coercivity of the second ferromagnetic layer 2 is greater than that of the first ferromagnetic layer 1. The second ferromagnetic layer 2 has an axis of easy magnetization in the same direction as the first ferromagnetic layer 1. The second ferromagnetic layer 2 may be either an in-plane magnetization film or a perpendicular magnetization film.

For example, the material constituting the second ferromagnetic layer 2 is similar to that of the first ferromagnetic layer 1. The second ferromagnetic layer 2 may be, for example, a laminate in which Co having a thickness of 0.4 nm to 1.0 nm, Mo having a thickness of 0.1 nm to 0.5 nm, a CoFeB alloy having a thickness of 0.3 nm to 1.0 nm, and Fe having a thickness of 0.3 nm to 1.0 nm are laminated in that order.

The magnetization of the second ferromagnetic layer 2 may be fixed by, for example, magnetic coupling to the third ferromagnetic layer via a magnetic coupling layer. In this case, a combination of the second ferromagnetic layer 2, the magnetic coupling layer, and the third ferromagnetic layer may be called a magnetization fixed layer.

The third ferromagnetic layer is magnetically coupled to, for example, the second ferromagnetic layer 2. The magnetic coupling is, for example, antiferromagnetic coupling and is caused by Ruderman-Kittel-Kasuya-Yosida (RKKY) interaction. The material constituting the third ferromagnetic layer is, for example, similar to that of the first ferromagnetic layer 1. The magnetic coupling layer is, for example, Ru, Ir, or the like.

The spacer layer 3 is a nonmagnetic layer arranged between the first ferromagnetic layer 1 and the second ferromagnetic layer 2. The spacer layer 3 includes a layer made of a conductor, an insulator, or a semiconductor or a layer including a current carrying point formed of a conductor within an insulator. A thickness of the spacer layer 3 can be adjusted in accordance with orientation directions of the magnetization of the first ferromagnetic layer 1 and the magnetization of the second ferromagnetic layer 2 in an initial state to be described below.

For example, when the spacer layer 3 is made of an insulator, the magnetic element 10 has a magnetic tunnel junction (MTJ) including the first ferromagnetic layer 1, the spacer layer 3, and the second ferromagnetic layer 2. Such an element is called an MTJ element. In this case, the magnetic element 10 can exhibit a tunnel magnetoresistance (TMR) effect. For example, when the spacer layer 3 is made of a metal, the magnetic element 10 can exhibit a giant magnetoresistance (GMR) effect. Such an element is called a GMR element. The magnetic element 10 may be called the MTJ element, the GMR element, or the like, which differs according to the constituent material of the spacer layer 3, but they may also be collectively called magnetoresistance effect elements.

When the spacer layer 3 is made of an insulating material, materials including aluminum oxide, magnesium oxide, titanium oxide, silicon oxide, and the like can be used. Also, these insulating materials may include elements such as Al, B, Si, and Mg and magnetic elements such as Co, Fe, and Ni. A high magnetoresistance change rate can be obtained by adjusting the thickness of the spacer layer 3 so that a strong TMR effect is exhibited between the first ferromagnetic layer 1 and the second ferromagnetic layer 2. In order to use the TMR effect efficiently, the thickness of the spacer layer 3 may be about 0.5 to 5.0 nm or about 1.0 to 2.5 nm.

When the spacer layer 3 is made of a nonmagnetic conductive material, a conductive material such as Cu, Ag, Au, or Ru can be used. In order to use the GMR effect efficiently, the thickness of the spacer layer 3 may be about 0.5 to 5.0 nm or about 2.0 to 3.0 nm.

When the spacer layer 3 is made of a nonmagnetic semiconductor material, a material such as zinc oxide, indium oxide, tin oxide, germanium oxide, gallium oxide, or indium tin oxide (ITO) can be used. In this case, the thickness of the spacer layer 3 may be about 1.0 to 4.0 nm.

When a layer including a current carrying point made of a conductor within a nonmagnetic insulator is applied as the spacer layer 3, a structure may be formed to include a current carrying point made of a nonmagnetic conductor of Cu, Au, Al, or the like within the nonmagnetic insulator made of aluminum oxide or magnesium oxide. Also, the conductor may be made of a magnetic element such as Co, Fe, or Ni. In this case, the thickness of the spacer layer 3 may be about 1.0 to 2.5 nm. The current carrying point is, for example, a columnar body having a diameter of 1 nm or more and 5 nm or less when viewed from a direction perpendicular to a film surface.

The cap layer 4 is between the first ferromagnetic layer 1 and the first electrode 11. The cap layer 4 prevents damage to the lower layer during the process and enhances the crystallinity of the lower layer during annealing. The thickness of the cap layer 4 is, for example, 3 nm or less so that sufficient light is applied to the first ferromagnetic layer 1. The cap layer 4 is, for example, MgO, W, Mo, Ru, Ta, Cu, Cr, or a laminated film thereof.

The magnetic element 10 may also have a base layer, a perpendicular magnetization inducing layer, and the like. The base layer is between the second ferromagnetic layer 2 and the second electrode 12. The base layer is a seed layer or a buffer layer. The seed layer enhances the crystallinity of the layer laminated on the seed layer. The seed layer is, for example, Pt, Ru, Hf, Zr, or NiFeCr. A thickness of the seed layer is, for example, 1 nm or more and 5 nm or less. The buffer layer is a layer that alleviates lattice mismatch between different crystals. The buffer layer is, for example, Ta, Ti, W, Zr, Hf, or a nitride of these elements. A thickness of the buffer layer is, for example, 1 nm or more and 5 nm or less.

A perpendicular magnetization inducing layer is formed when the first ferromagnetic layer 1 is a perpendicular magnetization film. The perpendicular magnetization inducing layer is laminated on the first ferromagnetic layer 1. The perpendicular magnetization inducing layer induces perpendicular magnetic anisotropy of the first ferromagnetic layer 1. The perpendicular magnetization inducing layer is, for example, magnesium oxide, W, Ta, Mo, or the like. When the perpendicular magnetization inducing layer is magnesium oxide, magnesium oxide may be oxygen-deficient to increase conductivity. A thickness of the perpendicular magnetization inducing layer is, for example, 0.5 nm or more and 2.0 nm or less.

The first electrode 11 is in contact with a first surface of the magnetic element 10. The first surface is a surface of the magnetic element 10 on a side of the first ferromagnetic layer 1 (a first ferromagnetic layer side) in the z direction. The first electrode 11 has, for example, transparency with respect to a wavelength range of the light applied to the magnetic element 10.

The first electrode 11 includes, for example, an oxide having transparency with respect the wavelength range of the light applied to the magnetic element 10. The first electrode 11 is a transparent electrode including a transparent electrode material of an oxide such as indium tin oxide (ITO), indium zinc oxide (IZO), zinc oxide (ZnO), or indium gallium zinc oxide (IGZO). The first electrode 11 may be configured to have a plurality of columnar metals in these transparent electrode materials. In this case, a film thickness of the first electrode 11 is, for example, 10 nm to 300 nm. It is not essential to use the above-described transparent electrode material as the first electrode 11 and light from the outside may be allowed to reach the first ferromagnetic layer 1 using a metallic material such as Au, Cu, or Al with a thin film thickness. When a metal is used as the material of the first electrode 11, the film thickness of the first electrode 11 is, for example, 3 to 10 nm. In particular, Au has higher transmittance for light having a wavelength near a blue wavelength of light than other metallic materials. Also, the first electrode 11 may have an antireflection film on an irradiation surface to which light is applied.

The second electrode 12 is made of a conductive material. The second electrode 12 is made of, for example, metals such as Cu, Al, Au, and Ru. Ta and/or Ti may be laminated on the top and bottom of the above metals. Also, a laminated film of Cu and Ta, a laminated film of Ta, Cu, and Ti, and a laminated film of Ta, Cu, and TaN may be used. Also, TiN and/or TaN may be used as the second electrode 12. A film thickness of the second electrode 12 is for example, 200 nm to 800 nm.

The second electrode 12 may be made transparent to light applied to the magnetic element 10. As the material of the second electrode 12, as in the first electrode 11, for example, a transparent electrode material of an oxide such as indium tin oxide (ITO), indium zinc oxide (IZO), zinc oxide (ZnO), or indium gallium zinc oxide (IGZO) may be used. Even if light is applied from the first electrode 11, the light may reach the second electrode 12 according to the intensity of the light. In this case, the second electrode 12 is configured to include a transparent electrode material of an oxide, so that the reflection of light at an interface between the second electrode 12 and a layer in contact with the second electrode 12 can be limited as compared with the case where the second electrode 12 is made of a metal.

The first high thermal conductivity layer 20 is located outside of the first ferromagnetic layer 1 when viewed from the z direction. The first high thermal conductivity layer 20 is located, for example, outside of the magnetic element 10 in the in-plane direction and covers at least a part of a sidewall of the magnetic element 10. The first high thermal conductivity layer 20 is connected to the magnetic element 10 via, for example, the insulating layer 30. The first high thermal conductivity layer 20 surrounds, for example, the circumference of at least a part of the magnetic element 10. For example, the first high thermal conductivity layer 20 surrounds the circumference of the first ferromagnetic layer 1 of the magnetic element 10. The first high thermal conductivity layer 20 is in contact with, for example, the first electrode 11. When the first high thermal conductivity layer 20 and the first electrode 11 come into contact with each other, a heat path from the first high thermal conductivity layer 20 to the wiring via the first electrode 11 is formed and heat can be efficiently dissipated from the magnetic element 10.

The first high thermal conductivity layer 20 has higher thermal conductivity than the first electrode 11. The first high thermal conductivity layer 20 has higher thermal conductivity than, for example, the insulating layer 30. The thermal conductivity of the first high thermal conductivity layer 20 is, for example, greater than 40 W/m·K. A part of the heat generated by the magnetic element 10 is dissipated via the first high thermal conductivity layer 20.

The first high thermal conductivity layer 20 is, for example, a metal. The first high thermal conductivity layer 20 is, for example, nonmagnetic. If the first high thermal conductivity layer 20 is nonmagnetic, no leakage magnetic field is generated from the first high thermal conductivity layer 20 and it is possible to limit deterioration of the magnetic characteristics of the magnetic element 10. When the first high thermal conductivity layer 20 is a nonmagnetic metal, for example, even if the first electrode 11 is a metal and the first electrode 11 has a higher thermal conductivity than the first high thermal conductivity layer 20, the first high thermal conductivity layer 20 has high thermal conductivity. Thus, even if the first electrode 11 has higher thermal conductivity than the first high thermal conductivity layer 20, heat can be efficiently dissipated from the magnetic element 10. The first high thermal conductivity layer 20 includes, for example, copper, gold, or silver.

The first high thermal conductivity layer 20 may be an insulator. When the first high thermal conductivity layer 20 is made of an insulator, the first high thermal conductivity layer 20 includes, for example, silicon carbide, aluminum nitride, or boron nitride.

The insulating layer 30 is located between the magnetic element 10 and the first high thermal conductivity layer 20. The insulating layer 30 covers, for example, the circumference of the magnetic element 10. The insulating layer 30 is, for example, an oxide of Si, Al, or Mg, a nitride, or an oxynitride. The insulating layer 30 is, for example, silicon oxide ($SiO_x$), silicon nitride ($SiN_x$), silicon carbide (SiC), chromium nitride, silicon nitride (SiCN), silicon oxynitride (SiON), aluminum oxide ($Al_2O_3$), and zirconium oxide ($ZrO_x$), or the like.

The photodetection element 100 is manufactured by a laminating process, an annealing process, and a processing process on each layer. First, the second electrode 12, the second ferromagnetic layer 2, the spacer layer 3, the first ferromagnetic layer 1, and the cap layer 4 are laminated on the substrate in that order. Each layer is formed by, for example, sputtering.

Subsequently, the laminated film is annealed. An annealing temperature is, for example, 250° C. to 450° C. When the substrate is a circuit board, the laminated film may be annealed at 400° C. or higher. Subsequently, the laminated film is processed into a prescribed columnar body by photolithography and etching. The columnar body may be a cylindrical body or a prismatic body. For example, the shortest width when the columnar body is viewed from the z direction may be 10 nm or more and 2000 nm or less or 30 nm or more and 500 nm or less.

Subsequently, the insulating layer 30 is formed to cover the side surface of the columnar body. The insulating layer 30 may be laminated a plurality of times. Subsequently, the first high thermal conductivity layer 20 is formed on the insulating layer 30. Subsequently, the upper surface of the cap layer 4 is exposed from the insulating layer 30 and the first high thermal conductivity layer 20 by chemical mechanical polishing (CMP) and the first electrode 11 is manufactured on the cap layer 4. In the above-described process, the photodetection element 100 is obtained.

Next, some examples of the operation of the photodetection element 100 will be described. Light whose intensity changes is applied to the first ferromagnetic layer 1. An output voltage from the photodetection element 100 changes when light is applied to the first ferromagnetic layer 1. In the first operation example, the case where the intensities of the light applied to the first ferromagnetic layer 1 are two levels of a first intensity and a second intensity will be described. The intensity of light of the second intensity is set to be greater than the intensity of light of the first intensity. The first intensity may correspond to the case where the intensity of light applied to the first ferromagnetic layer 1 is zero.

Figure 2:
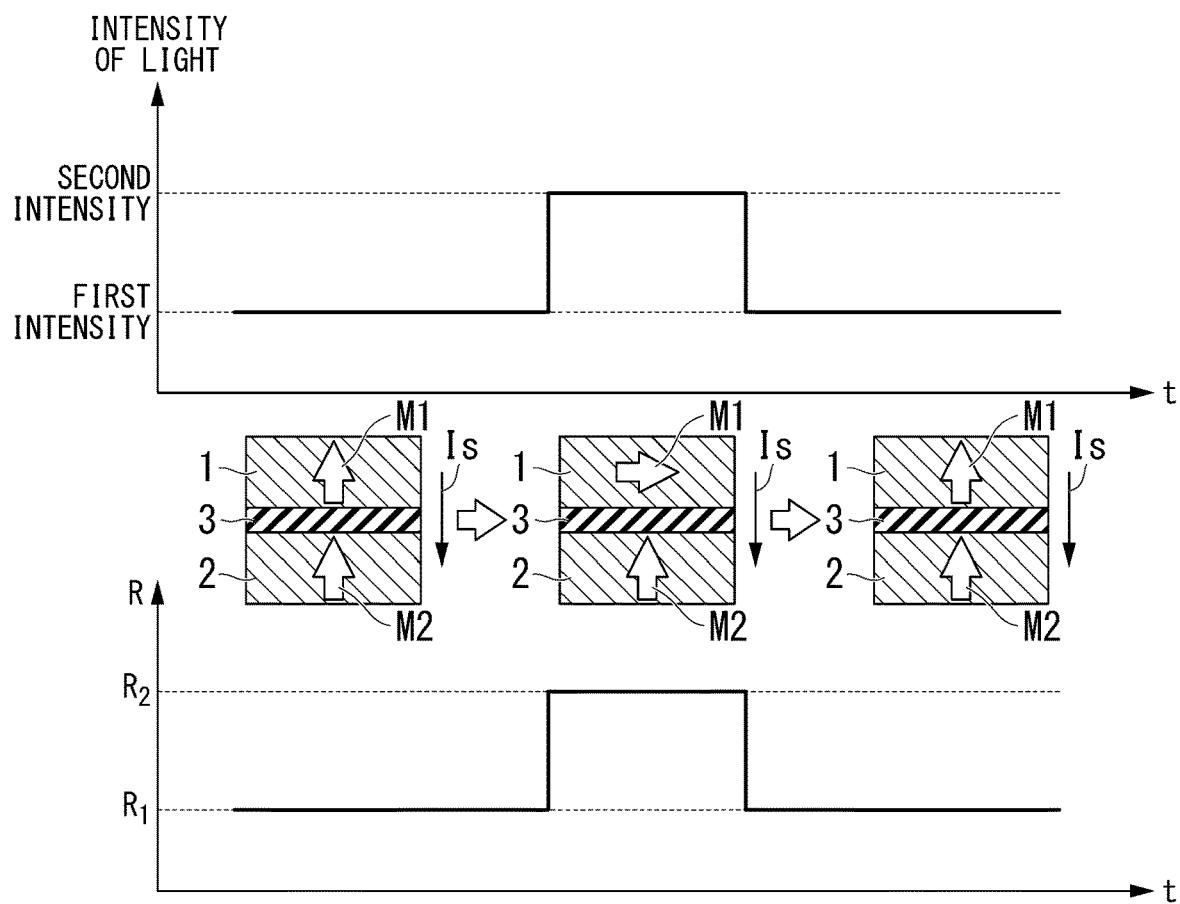
FIG. 2 is a diagram for describing a first mechanism of a first operation example of the photodetection element according to the first embodiment.
Figure 3:
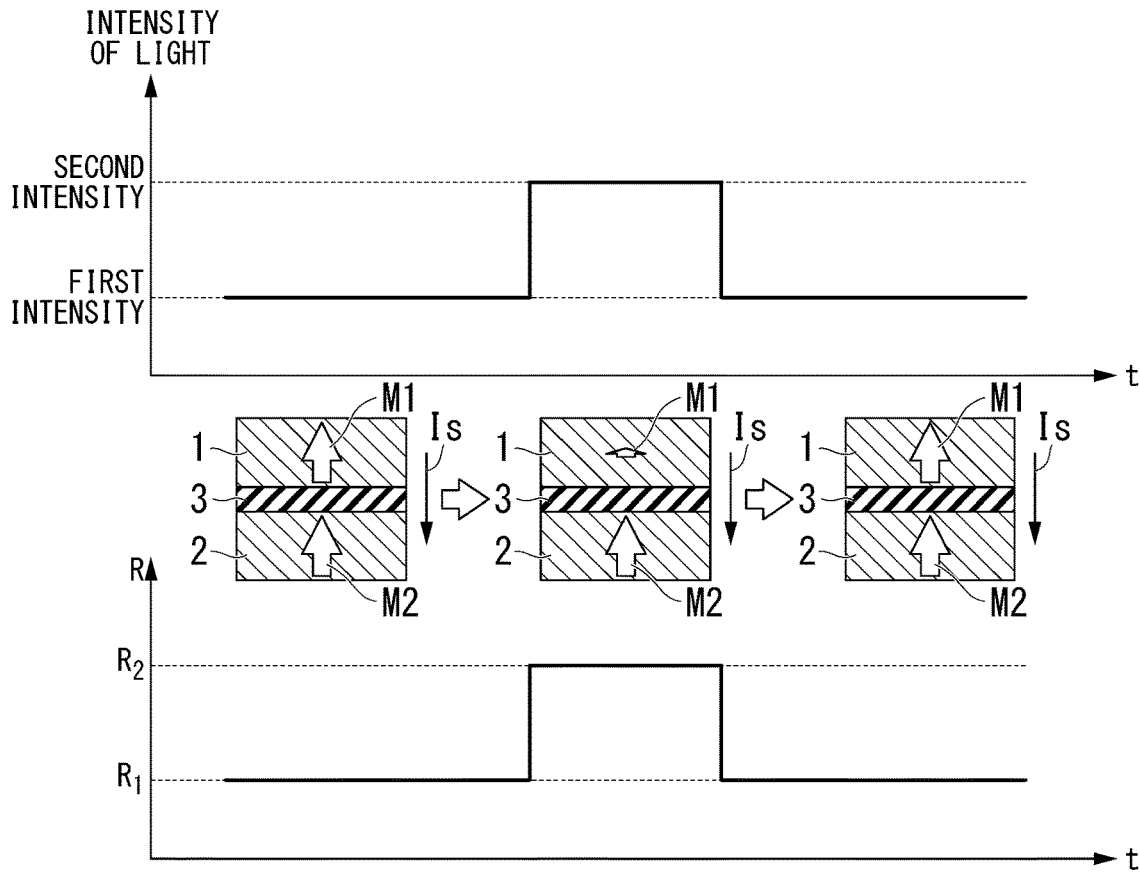
FIG. 3 is a diagram for describing a second mechanism of the first operation example of the photodetection element according to the first embodiment.

FIGS. 2 and 3 are diagrams for describing a first operation example of the photodetection element 100 according to the first embodiment. FIG. 2 is a diagram for describing a first mechanism of the first operation example and FIG. 3 is a diagram for describing a second mechanism of the first operation example. In the upper graphs of FIGS. 2 and 3, the vertical axis represents an intensity of light applied to the first ferromagnetic layer 1 and the horizontal axis represents time. In the lower graphs of FIGS. 2 and 3, the vertical axis represents a resistance value of the magnetic element 10 in the z direction and the horizontal axis represents time.

First, in a state in which light of the first intensity is applied to the first ferromagnetic layer 1 (hereinafter called an initial state), magnetization M1 of the first ferromagnetic layer 1 is parallel to magnetization M2 of the second ferromagnetic layer 2 and a resistance value of the magnetic element 10 in the z direction is a first resistance value $R_1$, and a magnitude of an output voltage from the magnetic element 10 indicates a first value. The resistance value of the magnetic element 10 in the z direction is obtained by causing a sense current Is to flow through the magnetic element 10 in the z direction to generate a voltage across both ends of the magnetic element 10 in the z direction and using Ohm's law from a voltage value. An output voltage from the magnetic element 10 is generated between the first electrode 11 and the second electrode 12. In the case of the example shown in FIG. 2, the sense current Is flows in a direction from the first ferromagnetic layer 1 to the second ferromagnetic layer 2. By causing the sense current Is to flow in the above direction, spin transfer torque in a direction, which is the same as that of the magnetization M2 of the second ferromagnetic layer 2, acts on the magnetization M1 of the first ferromagnetic layer 1, and the magnetization M1 becomes parallel to the magnetization M2 in the initial state. Also, by causing the sense current Is to flow in the above direction, it is possible to prevent the magnetization M1 of the first ferromagnetic layer 1 from being inverted during operation.

Next, the intensity of the light applied to the first ferromagnetic layer 1 changes from the first intensity to the second intensity. The second intensity is greater than the first intensity and the magnetization M1 of the first ferromagnetic layer 1 changes from the initial state. The state of the magnetization M1 of the first ferromagnetic layer 1 in the state in which no light is applied to the first ferromagnetic layer 1 is different from the state of the magnetization M1 of the first ferromagnetic layer 1 in the second intensity. The state of the magnetization M1 is, for example, a tilt angle with respect to the z direction, a magnitude, or the like.

For example, as shown in FIG. 2, when the intensity of the light applied to the first ferromagnetic layer 1 changes from the first intensity to the second intensity, the magnetization M1 is tilted in the z direction. Also, for example, as shown in FIG. 3, when the intensity of the light applied to the first ferromagnetic layer 1 changes from the first intensity to the second intensity, the magnitude of the magnetization M1 becomes small. For example, when the magnetization M1 of the first ferromagnetic layer 1 is tilted in the z direction due to an irradiation intensity of light, a tilt angle thereof is larger than 0° and smaller than 90°.

When the magnetization M1 of the first ferromagnetic layer 1 changes from the initial state, the resistance value of the magnetoresistance effect element 10 in the z direction is a second resistance value $R_2$ and a magnitude of the output voltage from the magnetic element 10 is a second value. The second resistance value $R_2$ is larger than the first resistance value $R_1$ and the second value of the output voltage is larger than the first value. The second resistance value $R_2$ is between the resistance value (the first resistance value $R_1$) when the magnetization M1 and the magnetization M2 are parallel and the resistance value when the magnetization M1 and the magnetization M2 are antiparallel.

In the case shown in FIG. 2, spin transfer torque in a direction, which is the same as that of the magnetization M2 of the second ferromagnetic layer 2, acts on the magnetization M1 of the first ferromagnetic layer 1. Therefore, the magnetization M1 tries to return to a state in which the magnetization M1 is parallel to the magnetization M2 and the magnetic element 10 returns to the initial state when the intensity of the light applied to the first ferromagnetic layer 1 changes from the second intensity to the first intensity. In the case shown in FIG. 3, when the intensity of the light applied to the first ferromagnetic layer 1 returns to the first intensity, the magnitude of the magnetization M1 of the first ferromagnetic layer 1 returns to the original magnitude and the magnetic element 10 returns to the initial state. In either case, the resistance value of the magnetic element 10 in the z direction returns to the first resistance value $R_1$. That is, when the intensity of the light applied to the first ferromagnetic layer 1 changes from the second intensity to the first intensity, the resistance value of the photodetection element 100 in the z direction changes from the second resistance value $R_2$ to the first resistance value $R_1$.

The output voltage from the photodetection element 100 changes in correspondence with a change in the intensity of the light applied to the first ferromagnetic layer 1 and the change in the intensity of the applied light can be transformed into a change in the output voltage from the photodetection element 100. That is, the photodetection element 100 can replace the light with an electrical signal. For example, the case where the output voltage from the photodetection element 100 is greater than or equal to a threshold value is treated as a first signal (for example, "1") and the case where the output voltage is less than the threshold value is treated as a second signal (for example, "0").

Although the case where the magnetization M1 is parallel to the magnetization M2 in the initial state has been described as an example here, the magnetization M1 may be antiparallel to the magnetization M2 in the initial state. In this case, the resistance value of the magnetic element 10 in the z direction decreases as the state of the magnetization M1 changes (for example, as the change in the angle of the magnetization M1 increases from the initial state). When the initial state is the case where the magnetization M1 is antiparallel to the magnetization M2, the sense current may flow in a direction from the second ferromagnetic layer 2 to the first ferromagnetic layer 1. By causing the sense current to flow in the above direction, spin transfer torque in a direction opposite to that of the magnetization M2 of the second ferromagnetic layer 2 acts on the magnetization M1 of the first ferromagnetic layer 1 and the magnetization M1 becomes antiparallel to the magnetization M2 in the initial state.

In the first operation example, the case where the light applied to the first ferromagnetic layer 1 has two levels of the first intensity and the second intensity has been described as an example, but in the second operation example, the case where the intensity of the light applied to the first ferromagnetic layer 1 changes at multiple levels or in an analog manner will be described.

Figure 4:
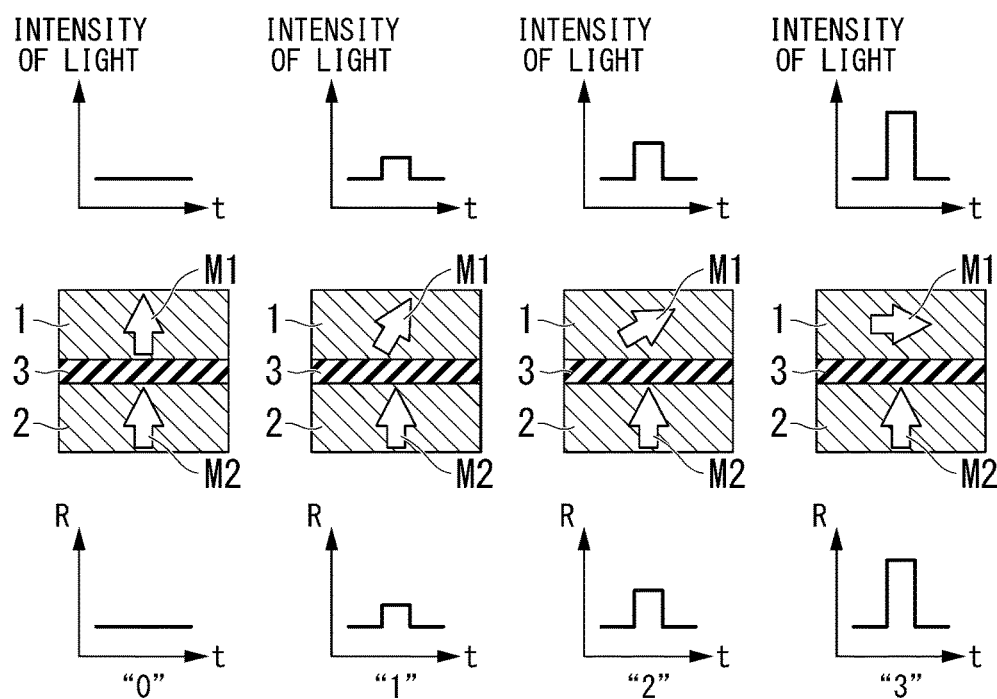
FIG. 4 is a diagram for describing a first mechanism of a second operation example of the photodetection element according to the first embodiment.
Figure 5:
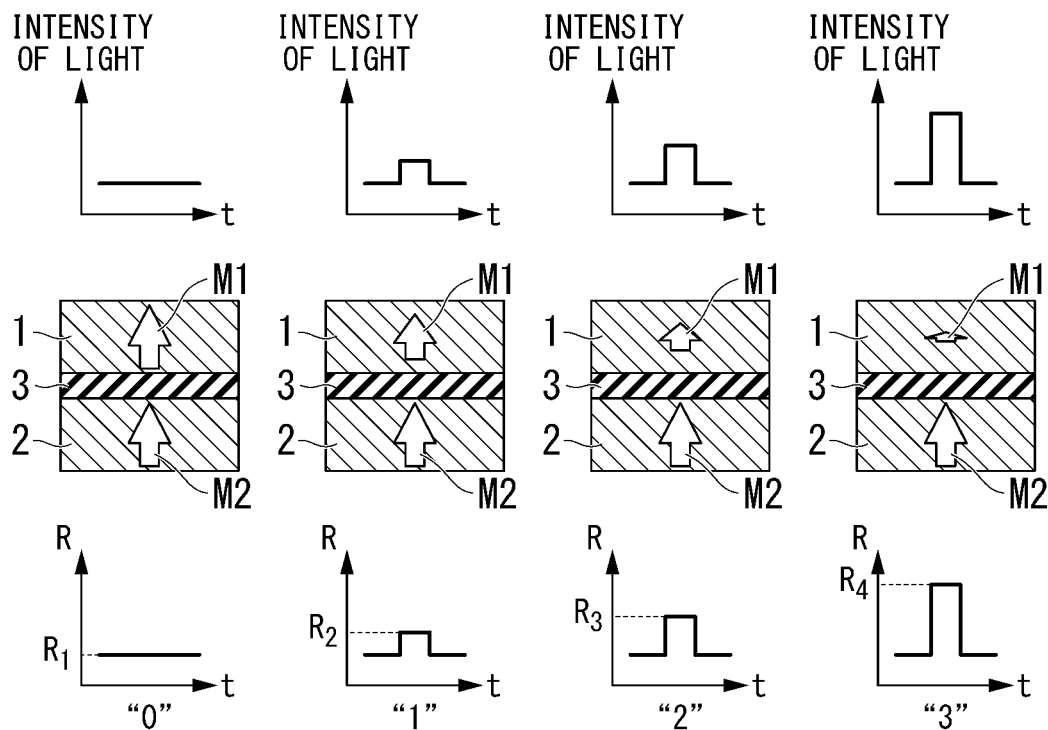
FIG. 5 is a diagram for describing a second mechanism of the second operation example of the photodetection element according to the first embodiment.

FIGS. 4 and 5 are diagrams for describing a second operation example of the photodetection element 100 according to the first embodiment. FIG. 4 is a diagram for describing a first mechanism of the first operation example and FIG. 5 is a diagram for describing a second mechanism of the first operation example. In the upper graphs of FIGS. 4 and 5, the vertical axis represents an intensity of light applied to the first ferromagnetic layer 1 and the horizontal axis represents time. In the lower graphs of FIGS. 4 and 5, the vertical axis represents a resistance value of the magnetic element 10 in the z direction and the horizontal axis represents time.

In the case of FIG. 4, when the intensity of the light applied to the first ferromagnetic layer 1 changes, the magnetization M1 of the first ferromagnetic layer 1 is tilted from the initial state due to external energy generated by the application of the light. An angle between the direction of the magnetization M1 of the first ferromagnetic layer 1 when no light is applied to the first ferromagnetic layer 1 and the direction of the magnetization M1 when light is applied to the first ferromagnetic layer 1 is greater than 0° and less than 90°.

When the magnetization M1 of the first ferromagnetic layer 1 is tilted from the initial state, the resistance value of the magnetoresistance effect element 10 in the z direction changes. The output voltage from the magnetic element 10 changes. For example, the resistance value of the magnetic element 10 in the z direction changes to a second resistance value $R_2$, a third resistance value $R_3$, and a fourth resistance value $R_4$ in accordance with the tilt of the magnetization M1 of the first ferromagnetic layer 1 and the output voltage from the magnetic element 10 changes to a second value, a third value, and a fourth value. The resistance value increases in the order of the first resistance value $R_1$, the second resistance value $R_2$, the third resistance value $R_3$, and the fourth resistance value $R_4$. The output voltage from the magnetic element 10 increases in the order of the first value, the second value, the third value, and the fourth value.

In the magnetic element 10, when the intensity of the light applied to the first ferromagnetic layer 1 has changed, the output voltage from the magnetic element 10 (the resistance value of the magnetic element 10 in the z direction) changes. For example, when the first value (the first resistance value $R_1$) is defined as "0," the second value (second resistance value $R_2$) is defined as "1," the third value (third resistance value $R_3$) is defined as "2," and the fourth value (fourth resistance value $R_4$) is defined as "3," the photodetection element 100 can output information of four values. Although the case where four values are read is shown as an example here, the number of values to be read can be freely designed by setting the threshold value of the output voltage from the magnetic element 10 (the resistance value of the magnetic element 10). Also, the photodetection element 100 may output an analog value as it is.

Also, as in the case of FIG. 5, when the intensity of the light applied to the first ferromagnetic layer 1 changes, the magnitude of the magnetization M1 of the first ferromagnetic layer 1 decreases from the initial state due to the external energy generated by the application of the light. When the magnetization M1 of the first ferromagnetic layer 1 decreases from the initial state, the resistance value of the magnetoresistance effect element 10 in the z direction changes. The output voltage from the magnetic element 10 changes. For example, the resistance value of the magnetic element 10 in the z direction changes to the second resistance value $R_2$, the third resistance value $R_3$, and the fourth resistance value $R_4$ in accordance with the magnitude of the magnetization M1 of the first ferromagnetic layer 1. The output voltage from the magnetic element 10 changes to the second value, the third value, and the fourth value. Therefore, as in the case of FIG. 4, the photodetection element 100 can output the difference in these output voltages (resistance values) as multi-valued or analog data.

Also, in the case of the second operation example, as in the case of the first operation example, when the intensity of the light applied to the first ferromagnetic layer 1 returns to the first intensity, the magnetization M1 of the first ferromagnetic layer 1 returns to the original state and the magnetic element 10 returns to the initial state.

Although the case where the magnetization M1 is parallel to the magnetization M2 in the initial state has been described as an example here, the magnetization M1 may also be antiparallel to the magnetization M2 in the initial state in the second operation example.

As described above, the photodetection element 100 according to the first embodiment can replace the light with an electrical signal by replacing the light applied to the magnetic element 10 with the output voltage from the magnetic element 10. Also, the presence of the first high thermal conductivity layer 20 having high thermal conductivity on the outside of the magnetic element 10 that generates heat with the application of light can promote heat dissipation from the magnetic element 10. That is, when the application of light to the first ferromagnetic layer 1 is stopped, the magnetic element 10 is quickly cooled and the magnetization M1 is quickly restored to the initial state. When the magnetization M1 of the first ferromagnetic layer 1 returns to the initial state quickly, the response characteristics of the photodetection element 100 to light are improved. In other words, the speed of the response characteristic of the photodetection element 100 to light is increased.

Although the first embodiment has been described above in detail with reference to the drawings, the first embodiment is not limited to this example.

First Modified Example

Figure 6:
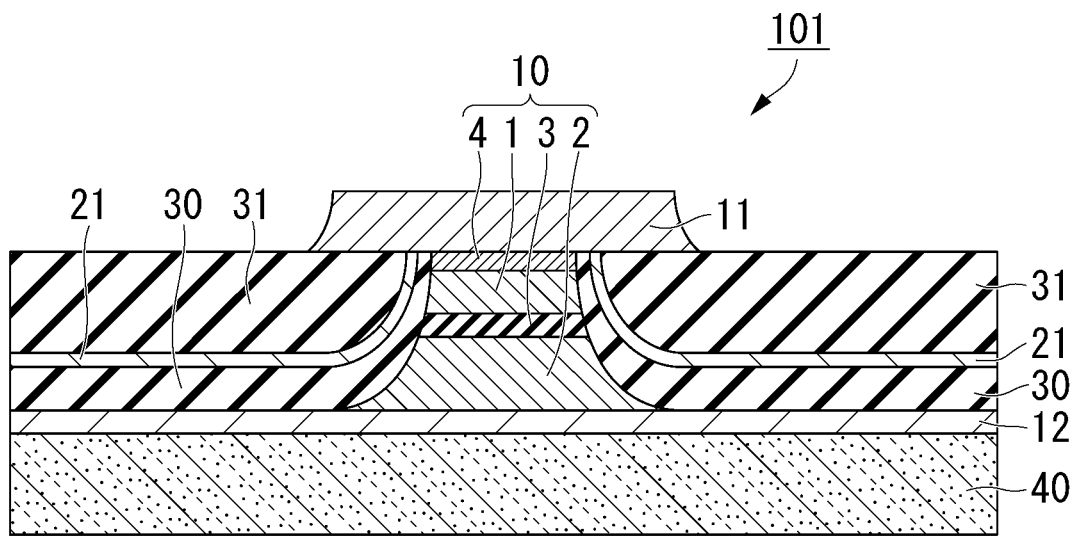
FIG. 6 is a cross-sectional view of a photodetection element according to a first modified example.

FIG. 6 is a cross-sectional view of a photodetection element 101 according to a first modified example. The photodetection element 101 includes, for example, a magnetic element 10, a first electrode 11, a second electrode 12, a first high thermal conductivity layer 21, insulating layers 30 and 31, and a substrate 40. In the first modified example, components similar to those in the first embodiment are denoted by similar reference signs and the description thereof will be omitted.

The first high thermal conductivity layer 21 is located outside of the first ferromagnetic layer 1 when viewed from the z direction. The first high thermal conductivity layer 21 is connected to the magnetic element 10 via, for example, the insulating layer 30. The first high thermal conductivity layer 21 surrounds, for example, the circumference of at least a part of the magnetic element 10. For example, the first high thermal conductivity layer 21 surrounds the circumference of the first ferromagnetic layer 1 of the magnetic element 10. The first high thermal conductivity layer 21 is in contact with, for example, the first electrode 11. The first high thermal conductivity layer 21 is sandwiched between the insulating layer 30 and the insulating layer 31.

The first high thermal conductivity layer 21 has higher thermal conductivity than the first electrode 11. The first high thermal conductivity layer 21 is made of a material similar to that of the first high thermal conductivity layer 20.

The insulating layer 31 covers an upper surface of the first high thermal conductivity layer 21. The insulating layer 31 sandwiches the first high thermal conductivity layer 21 with the insulating layer 30. The insulating layer 31 is made of a material similar to that of the insulating layer 30.

Because the photodetection element 101 according to the first modified example has the first high thermal conductivity layer 21, the photodetection element 101 has effects similar to those of the photodetection element 100.

Second Modified Example

Figure 7:
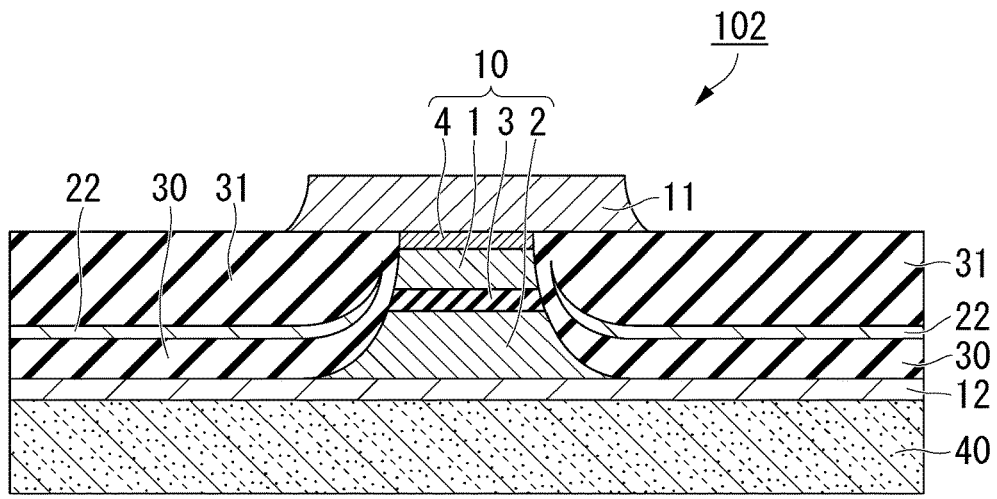
FIG. 7 is a cross-sectional view of a photodetection element according to a second modified example.

FIG. 7 is a cross-sectional view of a photodetection element 102 according to a second modified example. The photodetection element 102 includes, for example, a magnetic element 10, a first electrode 11, a second electrode 12, a first high thermal conductivity layer 22, insulating layers 30 and 31, and a substrate 40. In the second modified example, components similar to those in the first modified example are denoted by similar reference signs and the description thereof will be omitted.

The first high thermal conductivity layer 22 is located outside of the first ferromagnetic layer 1 when viewed from the z direction. The first high thermal conductivity layer 22 is different from the first high thermal conductivity layer 21 according to the first modified example in that the first high thermal conductivity layer 22 is not in contact with the first electrode 11.

Because the photodetection element 102 according to the second modified example has the first high thermal conductivity layer 22, the photodetection element 102 has effects similar to those of the photodetection element 100.

Third Modified Example

Figure 8:
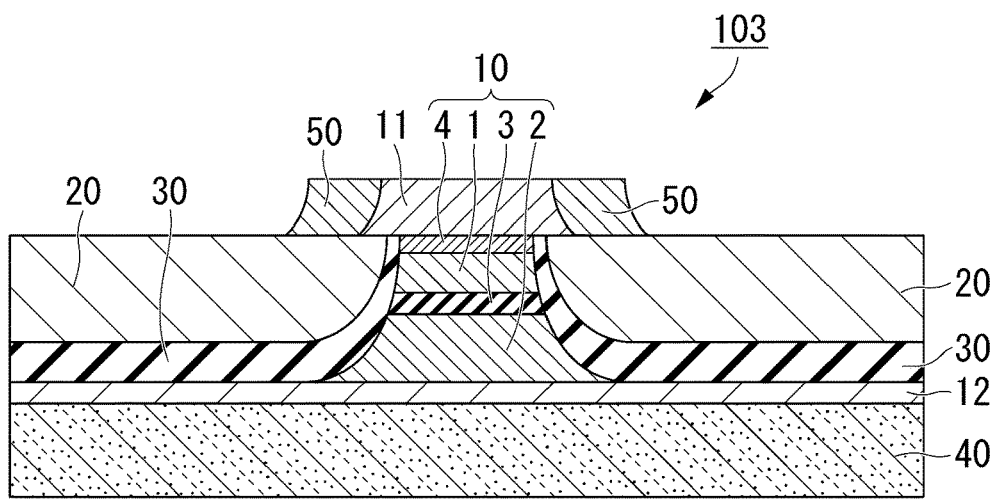
FIG. 8 is a cross-sectional view of a photodetection element according to a third modified example.

FIG. 8 is a cross-sectional view of a photodetection element 103 according to a third modified example. The photodetection element 103 includes, for example, a magnetic element 10, a first electrode 11, a second electrode 12, a first high thermal conductivity layer 20, an insulating layer 30, a substrate 40, and a second high thermal conductivity layer 50. In the third modified example, components similar to those in the first embodiment are denoted by similar reference signs and the description thereof will be omitted.

The second high thermal conductivity layer 50 is in contact with a sidewall of the first electrode 11. The second high thermal conductivity layer 50 surrounds, for example, the circumference of the first electrode 11. The second high thermal conductivity layer 50 has higher thermal conductivity than the first electrode 11. The second high thermal conductivity layer 50 is in contact with, for example, the first high thermal conductivity layer 20. When the second high thermal conductivity layer 50 and the first high thermal conductivity layer 20 come into contact with each other, heat can be expelled from the first high thermal conductivity layer 20 toward the second high thermal conductivity layer 50 and heat is efficiently dissipated from the magnetic element 10. A material similar to that of the first high thermal conductivity layer 20 can be applied to the second high thermal conductivity layer 50. The first high thermal conductivity layer 20 and the second high thermal conductivity layer 50 may be made of the same material or different materials.

Because the photodetection element 103 according to the third modified example has the first high thermal conductivity layer 20, the photodetection element 103 has effects similar to those of the photodetection element 100. Also, the photodetection element 103 has the second high thermal conductivity layer 50, so that the photodetection element 103 is more excellent in heat dissipation.

Fourth Modified Example

Figure 9:
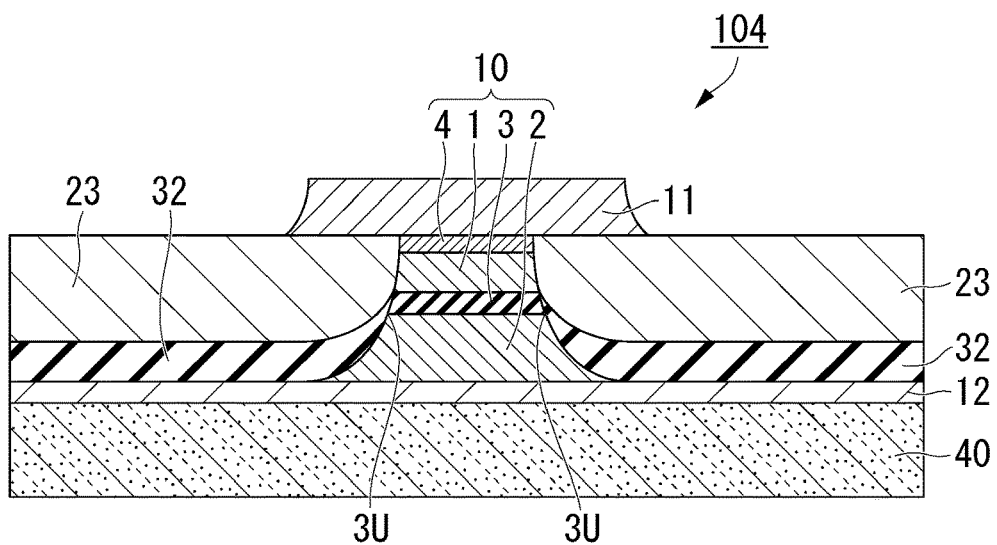
FIG. 9 is a cross-sectional view of a photodetection element according to a fourth modified example.

FIG. 9 is a cross-sectional view of a photodetection element 104 according to a fourth modified example. The photodetection element 104 includes, for example, a magnetic element 10, a first electrode 11, a second electrode 12, a first high thermal conductivity layer 23, an insulating layer 32, and a substrate 40. In the fourth modified example, components similar to those in the first embodiment are denoted by similar reference signs and the description thereof will be omitted.

The first high thermal conductivity layer 23 is located outside of the first ferromagnetic layer 1 when viewed from the z direction. The first high thermal conductivity layer 23 is in direct contact with the magnetic element 10. The first high thermal conductivity layer 23 is in direct contact with, for example, at least a part of the side surface of the first ferromagnetic layer 1. The first high thermal conductivity layer 23 surrounds the circumference of at least a part of the magnetic element 10. For example, the first high thermal conductivity layer 23 surrounds the circumference of the first ferromagnetic layer 1 of the magnetic element 10.

The first high thermal conductivity layer 23 has higher thermal conductivity than the first electrode 11. The first high thermal conductivity layer 23 is made of a material similar to that of the first high thermal conductivity layer 20.

A part of the insulating layer 32 is located between the magnetic element 10 and the first high thermal conductivity layer 23. The insulating layer 32 is made of a material similar to that of the insulating layer 30. The insulating layer 32 covers at least a portion below a lower end 3U of the spacer layer 3 within a sidewall of the magnetic element 10. By covering the portion below the lower end 3U of the spacer layer 3, the insulating layer 32 can prevent the first high thermal conductivity layer 23 and the second ferromagnetic layer 2 from being short-circuited even if the first high thermal conductivity layer 23 is a conductor.

Because the photodetection element 104 according to the fourth modified example has the first high thermal conductivity layer 23, the photodetection element 104 has effects similar to those of the photodetection element 100. Also, when the first high thermal conductivity layer 23 is in direct contact with the first ferromagnetic layer 1, the heat generated in the first ferromagnetic layer 1 can be dissipated more efficiently. Also, when the first high thermal conductivity layer 23 is a conductor, the insulating layer 32 prevents the first high thermal conductivity layer 23 and the second ferromagnetic layer 2 from being short-circuited, so that the deterioration of the magnetic characteristics of the magnetic element 10 can be limited.

Fifth Modified Example

Figure 10:
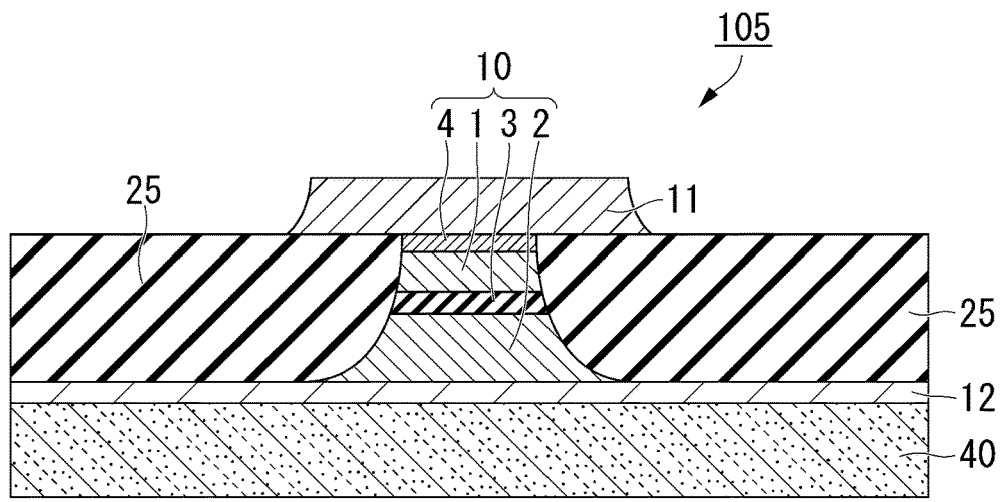
FIG. 10 is a cross-sectional view of a photodetection element according to a fifth modified example.

FIG. 10 is a cross-sectional view of a photodetection element 105 according to a fifth modified example. The photodetection element 105 includes, for example, a magnetic element 10, a first electrode 11, a second electrode 12, a first high thermal conductivity layer 25, and a substrate 40. In the fifth modified example, components similar to those in the first embodiment are denoted by similar reference signs and the description thereof will be omitted.

The first high thermal conductivity layer 25 is located outside of the first ferromagnetic layer 1 when viewed from the z direction. The first high thermal conductivity layer 25 is in direct contact with the magnetic element 10. The first high thermal conductivity layer 25 surrounds the circumference of the magnetic element 10.

The first high thermal conductivity layer 25 has higher thermal conductivity than the first electrode 11. The first high thermal conductivity layer 25 is an insulator. The thermal conductivity of the first high thermal conductivity layer 25 is, for example, greater than 40 W/m·K. The first high thermal conductivity layer 25 includes, for example, silicon carbide, aluminum nitride, or boron nitride.

Because the photodetection element 105 according to the fifth modified example has the first high thermal conductivity layer 25, the photodetection element 105 has effects similar to those of the photodetection element 100. Also, because the first high thermal conductivity layer 25 has an insulating property, it can be in direct contact with the entire side surface of the magnetic element 10. As a result, the photodetection element 105 can efficiently dissipate heat from the magnetic element 10.

Sixth Modified Example

Figure 11:
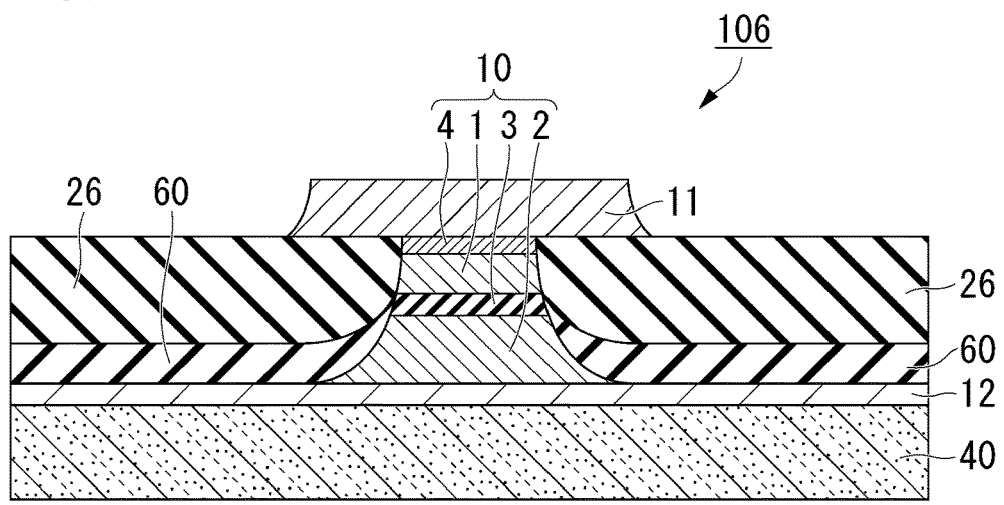
FIG. 11 is a cross-sectional view of a photodetection element according to a sixth modified example.

FIG. 11 is a cross-sectional view of a photodetection element 106 according to a sixth modified example. The photodetection element 106 includes, for example, a magnetic element 10, a first electrode 11, a second electrode 12, a first high thermal conductivity layer 26, a substrate 40, and a high resistivity layer 60. In the sixth modified example, components similar to those in the first embodiment are denoted by similar reference signs and the description thereof will be omitted.

The first high thermal conductivity layer 26 is located outside of the first ferromagnetic layer 1 when viewed from the z direction. The first high thermal conductivity layer 26 is in direct contact with, for example, the first ferromagnetic layer 1. The high resistivity layer 60 may be provided between the first high thermal conductivity layer 26 and the first ferromagnetic layer 1. The first high thermal conductivity layer 26 surrounds, for example, the circumference of the first ferromagnetic layer 1.

The first high thermal conductivity layer 26 has higher thermal conductivity than the first electrode 11. The first high thermal conductivity layer 26 is an insulator. The thermal conductivity of the first high thermal conductivity layer 26 is, for example, greater than 40 W/m·K. The first high thermal conductivity layer 26 includes, for example, silicon carbide, aluminum nitride, or boron nitride.

The high resistivity layer 60 is located between the first high thermal conductivity layer 26 and the second electrode 12. A part of the high resistivity layer 60 may be located between the magnetic element 10 and the first high thermal conductivity layer 26. The high resistivity layer 60 has higher resistivity than the first high thermal conductivity layer 26.

The high resistivity layer 60 is, for example, an insulator. The high resistivity layer 60 depends on a material constituting the first high thermal conductivity layer 26, but is, for example, aluminum oxide ($Al_2O_3$), zirconium oxide ($ZrO_2$), silicon oxide ($SiO_2$), silicon nitride ($Si_3N_4$), forsterite ($2MgO·SiO_2$), yttrium oxide ($Y_2O_3$), aluminum nitride (AlN), or boron nitride (BN).

For example, when the first high thermal conductivity layer 26 is silicon carbide (SiC), the high resistivity layer 60 may be aluminum oxide ($Al_2O_3$), zirconium oxide ($ZrO_2$), silicon oxide ($SiO_2$), silicon nitride ($Si_3N_4$), forsterite ($2MgO·SiO_2$), yttrium oxide ($Y_2O_3$), aluminum nitride (AlN), or boron nitride (BN). For example, when the first high thermal conductivity layer 26 is aluminum nitride (AlN) or boron nitride (BN), the high resistivity layer 60 may be silicon oxide ($SiO_2$).

Because the photodetection element 106 according to the sixth modified example has the first high thermal conductivity layer 26, the photodetection element 106 has effects similar to those of the photodetection element 100. Also, the high resistivity layer 60 is provided between the first electrode 11 and the second electrode 12, so that the insulating property between the first electrode 11 and the second electrode 12 can be enhanced.

Seventh Modified Example

Figure 12:
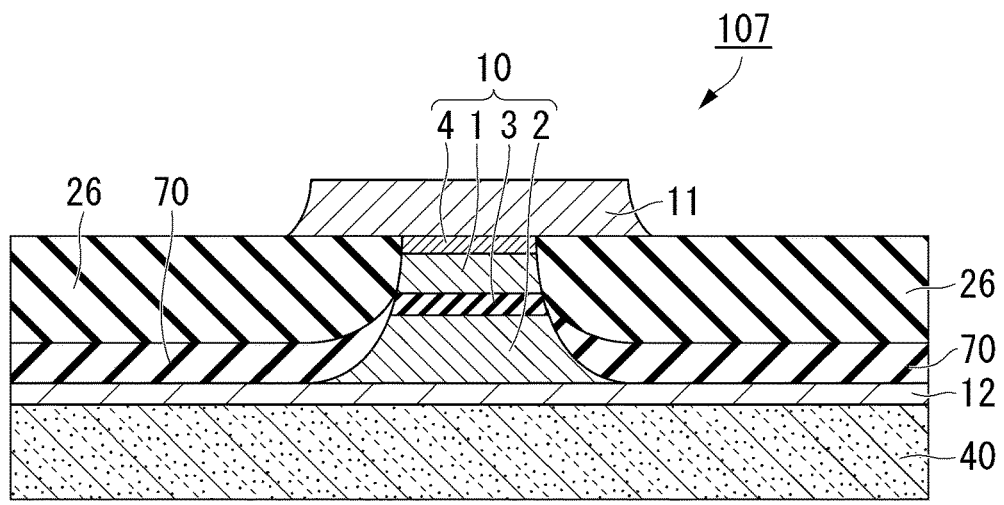
FIG. 12 is a cross-sectional view of a photodetection element according to a seventh modified example.

FIG. 12 is a cross-sectional view of a photodetection element 107 according to a seventh modified example. The photodetection element 107 includes, for example, a magnetic element 10, a first electrode 11, a second electrode 12, a first high thermal conductivity layer 26, a substrate 40, and a low dielectric constant layer 70. In the seventh modified example, components similar to those in the sixth modified example are denoted by similar reference signs and the description thereof will be omitted.

The low dielectric constant layer 70 is located between the first high thermal conductivity layer 26 and the second electrode 12. A part of the low dielectric constant layer 70 may be located between the magnetic element 10 and the first high thermal conductivity layer 26. The low dielectric constant layer 70 has a lower dielectric constant than the first high thermal conductivity layer 26.

The low dielectric constant layer 70 is, for example, an insulator. The low dielectric constant layer 70 depends on the material constituting the first high thermal conductivity layer 26, but, is for example, silicon oxide ($SiO_2$), silicon nitride ($Si_3N_4$), forsterite ($2MgO·SiO_2$), aluminum nitride (AlN), or boron nitride (BN).

For example, when the first high thermal conductivity layer 26 is silicon carbide (SiC), the low dielectric constant layer 70 may be silicon oxide ($SiO_2$), silicon nitride ($Si_3N_4$), forsterite ($2MgO·SiO_2$), aluminum nitride (AlN), or boron nitride (BN). For example, when the first high thermal conductivity layer 26 is aluminum nitride (AlN), the low dielectric constant layer 70 may be silicon oxide ($SiO_2$), forsterite ($2MgO·SiO_2$), or boron nitride (BN). For example, when the first high thermal conductivity layer 26 is boron nitride (BN), the low dielectric constant layer 70 may be silicon oxide ($SiO_2$).

Because the photodetection element 107 according to the seventh modified example has the first high thermal conductivity layer 26, the photodetection element 107 has effects similar to those of the photodetection element 100. Also, the low dielectric constant layer 70 is provided between the first electrode 11 and the second electrode 12, so that the capacitance between the first electrode 11 and the second electrode 12 can be reduced.

The present disclosure is not limited to the above-described embodiments and modified examples and various modifications and changes can be made within the scope of the subject matter of the present disclosure described within the scope of the claims. For example, the feature configurations of the above-described embodiment and modified examples may be combined.

The photodetection element according to the above-described embodiment and modified example can be applied to an optical sensor device such as an image sensor, a transceiver device of a communication system, or the like.

Figure 13:
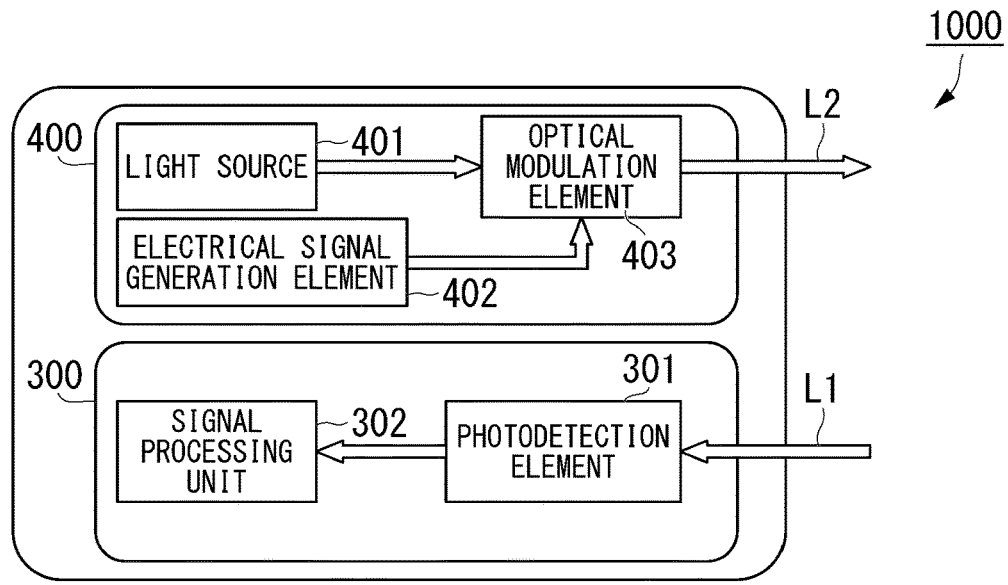
FIG. 13 is a block diagram of a transceiver device according to a first application example.

FIG. 13 is a block diagram of the transceiver device 1000 according to the first application example. The transceiver device 1000 includes a receiving device 300 and a transmission device 400. The receiving device 300 receives an optical signal L1 and the transmission device 400 transmits an optical signal L2.

The receiving device 300 includes, for example, a photodetection element 301 and a signal processing unit 302. The photodetection element 301 is any one of the photodetection elements 100 to 107 according to any one of the above-described embodiments and modified examples. The photodetection element 301 converts the optical signal L1 into an electrical signal. The operation of the photodetection element 301 may be either the first operation example or the second operation example. Light including the optical signal L1 having a change in an intensity of light is applied to the first ferromagnetic layer 1 of the photodetection element 301. A lens may be disposed on the side of the first ferromagnetic layer 1 in the lamination direction of the photodetection element 301, so that light condensed through the lens may be applied to the first ferromagnetic layer 1. The lens may be formed in the wafer process of forming the photodetection element 301. Also, the light passing through the waveguide may be applied to the first ferromagnetic layer 1 of the photodetection element 301. The light applied to the first ferromagnetic layer 1 of the photodetection element 301 is, for example, laser light. The signal processing unit 302 processes the electrical signal obtained in the conversion process of the photodetection element 301. The signal processing unit 302 receives a signal included in the optical signal L1 by processing the electrical signal generated from the photodetection element 301.

The transmission device 400 includes, for example, a light source 401, an electrical signal generation element 402, and a light modulation element 403. The light source 401 is, for example, a laser element. The light source 401 may be located outside of the transmission device 400. The electrical signal generation element 402 generates an electrical signal on the basis of the transmission information. The electrical signal generation element 402 may be integrated with the signal conversion element of the signal processing unit 302. The light modulation element 403 modulates light output from the light source 401 on the basis of the electrical signal generated by the electrical signal generation element 402 and outputs the optical signal L2.

Figure 14:
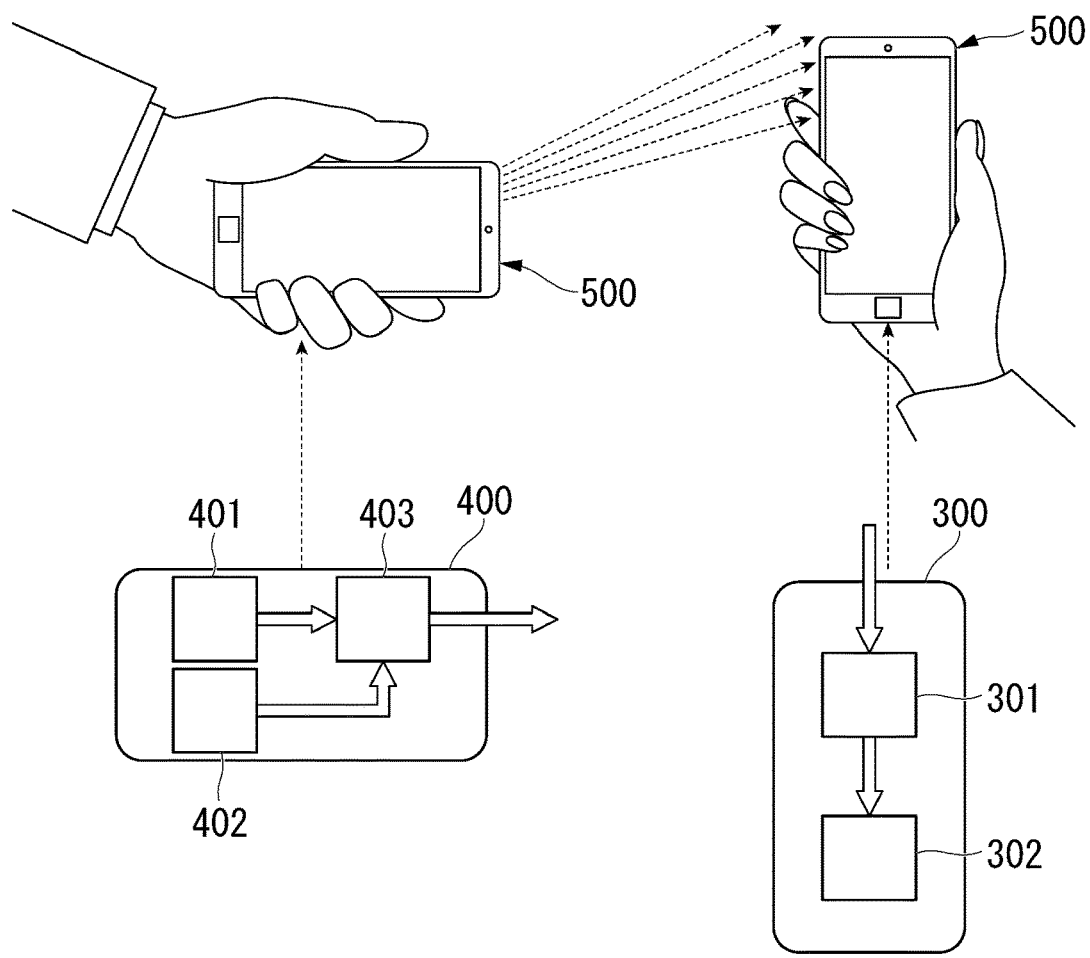
FIG. 14 is a conceptual diagram of an example of a communication system.

FIG. 14 is a conceptual diagram of an example of a communication system. The communication system shown in FIG. 14 has two terminal devices 500. The terminal device 500 is, for example, a smartphone, a tablet, a personal computer, or the like.

Each of the terminal devices 500 includes a receiving device 300 and a transmission device 400. An optical signal transmitted from the transmission device 400 of one terminal device 500 is received by the receiving device 300 of the other terminal device 500. The light used for transmission/receiver between the terminal devices 500 is, for example, visible light. The receiving device 300 has one of the above-described photodetection elements 100 to 107 as the photodetection element 301. Because the above-described photodetection elements 100 to 107 are excellent in heat dissipation, the communication system shown in FIG. 14 can implement high-speed communication.

Figure 15:
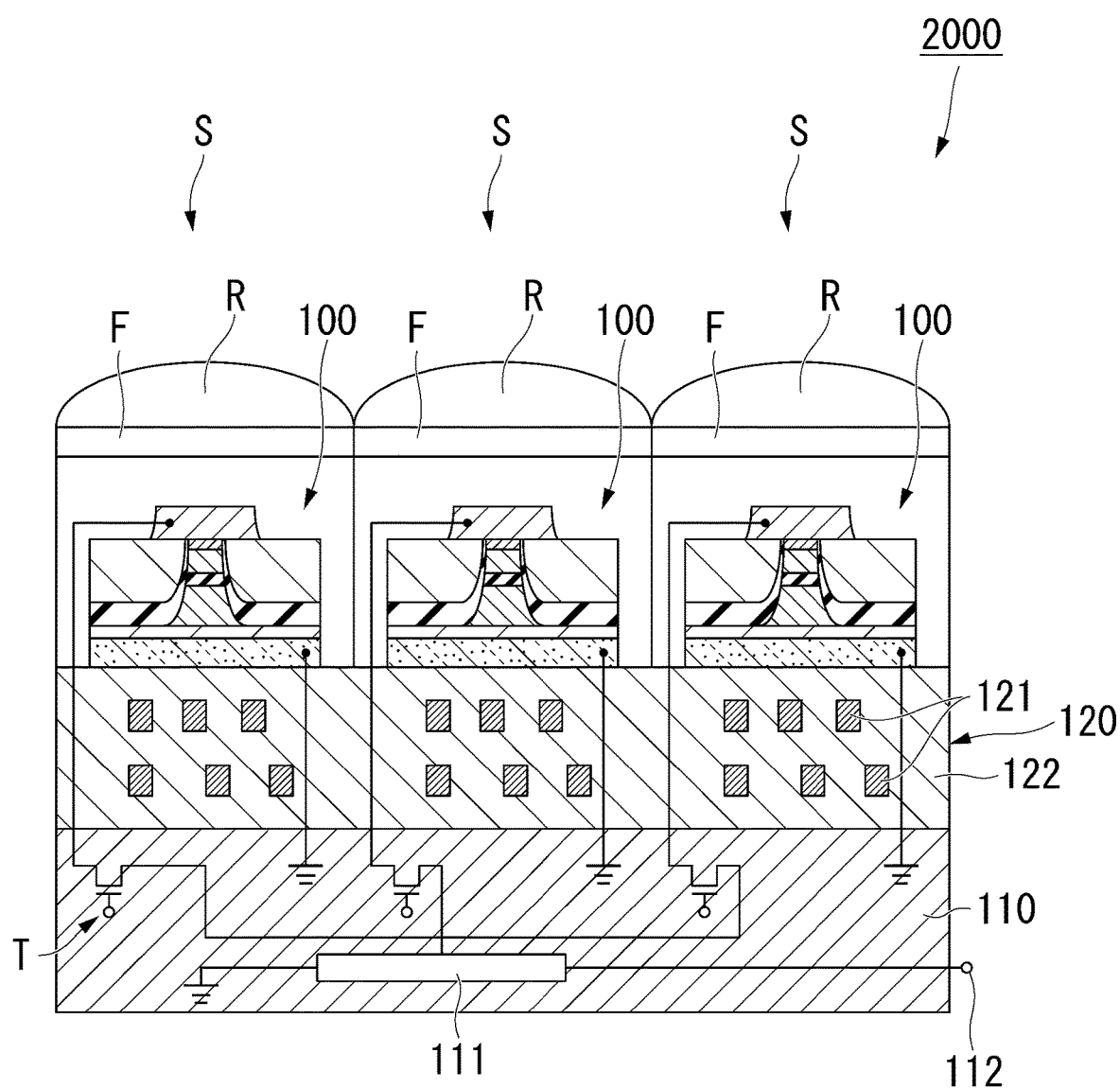
FIG. 15 is a conceptual diagram of a cross-section of an optical sensor device according to a second application example.

FIG. 15 is a conceptual diagram of a cross-section of an optical sensor device 2000 according to the second application example. The optical sensor device 2000 includes, for example, a circuit board 110, a wiring layer 120, and a plurality of optical sensors S. Each of the wiring layer 120 and the plurality of optical sensors S is formed on the circuit board 110.

Each of the plurality of optical sensors S includes, for example, a photodetection element 100, a wavelength filter F, and a lens R. Although an example in which the photodetection element 100 is used is shown in FIG. 15, the photodetection elements 101 to 106 may be used instead of the photodetection element 100. Light passing through the wavelength filter F is applied to the photodetection element 100. As described above, the photodetection element 100 replaces the light applied to the magnetic element 10 with an electrical signal. The photodetection element 100 may operate in the second operation example.

The wavelength filter F selects light of a specific wavelength and transmits light of a specific wavelength range. The wavelength range of light transmitted by each wavelength filter F may be the same or different. For example, the optical sensor device 2000 may include an optical sensor S (hereinafter referred to as a blue sensor) having a wavelength filter F that transmits light in blue (a wavelength range of 380 nm or more and less than 490 nm), an optical sensor S (hereinafter referred to as a green sensor) having a wavelength filter F that transmits light in green (a wavelength range of 490 nm or more and less than 590 nm), and an optical sensor S (hereinafter referred to as a red sensor) having a wavelength filter F that transmits light in red (a wavelength range of 590 nm or more and less than 800 nm). The blue sensor, the green sensor, and the red sensor are set as one pixel, and the optical sensor device 2000 can be used as an image sensor by arraying these pixels.

The lens R condenses light toward the magnetic element 10. Although one photodetection element 100 is disposed below one wavelength filter F in the optical sensor S shown in FIG. 15, a plurality of photodetection elements 100 may be disposed below one wavelength filter F.

The circuit board 110 has, for example, an analog-to-digital converter 111 and an output terminal 112. An electrical signal sent from the optical sensor S is replaced with digital data by the analog-to-digital converter 111 and is output from the output terminal 112.

The wiring layer 120 has two or more wirings 121. There is an interlayer insulating film 122 between the two or more wirings 121. The wiring 121 is electrically connected between each of the optical sensors S and the circuit board 110 and is electrically connected to each calculation circuit formed on the circuit board 110. Each of the optical sensors S and the circuit board 110 are connected, for example, via through-wiring passing through the interlayer insulating film 122 in the z direction. Noise can be reduced by shortening an inter-wiring distance between each of the optical sensors S and the circuit board 110.

The wiring 121 has conductivity. The wiring 121 is, for example, Al, Cu, or the like. The interlayer insulating film 122 is an insulator that provides insulation between the wirings of the multilayer wiring and between the elements. The interlayer insulating film 122 is, for example, an oxide, a nitride, or an oxynitride of Si, Al, or Mg. The interlayer insulating film 122 is, for example, silicon oxide ($SiO_x$), silicon nitride ($SiN_x$), silicon carbide (SiC), chromium nitride, silicon nitride (SiCN), silicon oxynitride (SiON), aluminum oxide ($Al_2O_3$), zirconium oxide ($ZrO_x$), or the like.

Figure 16:
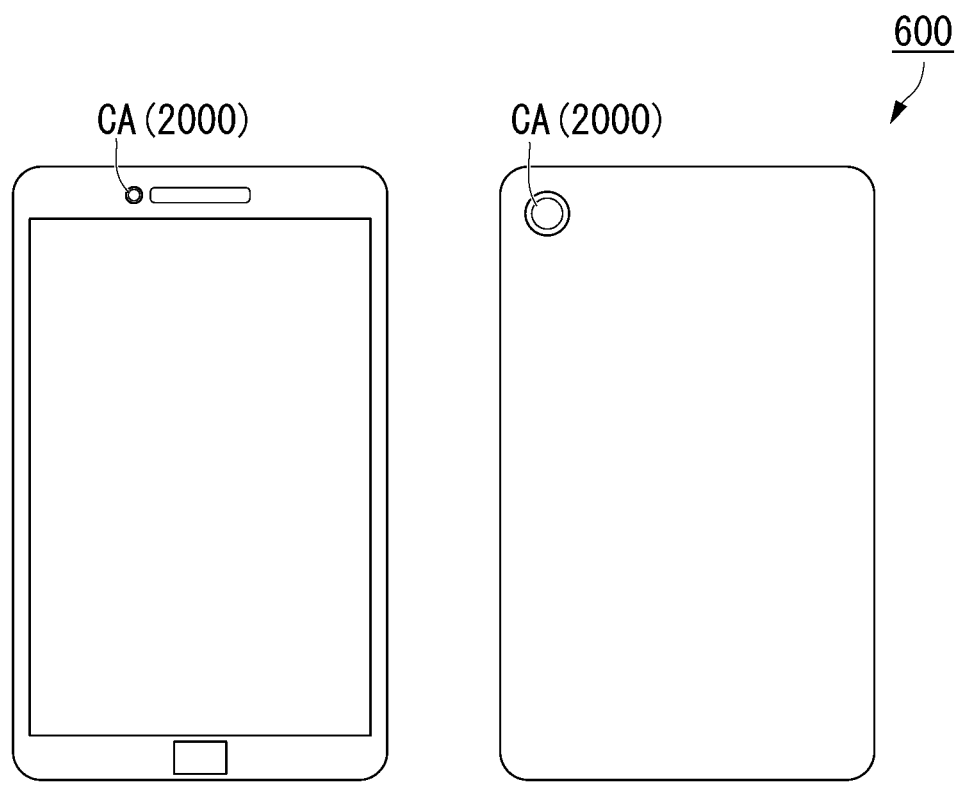
FIG. 16 is a schematic view of an example of a terminal device.

The above-described optical sensor device 2000 can be used, for example, in a terminal device. FIG. 16 is a schematic view of an example of a terminal device 600. The left side of FIG. 16 is a front surface of the terminal device 600 and the right side of FIG. 16 is a back surface of the terminal device 600. The terminal device 600 has a camera CA. The above-described optical sensor device 2000 can be used as an image sensor of this camera CA. Although a smartphone is shown as an example of the terminal device 600 in FIG. 16, the present disclosure is not limited to this case. The terminal device 600 is, for example, a tablet, a personal computer, a digital camera, or the like other than the smartphone.

What is claimed is:

1. A photodetection element comprising:
a magnetic element including a first ferromagnetic layer to which light is applied, a second ferromagnetic layer, and a spacer layer sandwiched between the first ferromagnetic layer and the second ferromagnetic layer;
a first electrode in contact with a first surface of the magnetic element, the first surface being located on a first ferromagnetic layer side of the magnetic element in a lamination direction;
a second electrode in contact with a second surface of the magnetic element, the second surface being opposite to the first surface; and
a first high thermal conductivity layer disposed outside of the first ferromagnetic layer and having higher thermal conductivity than the first electrode,
wherein the first electrode includes an oxide having transparency to the light.

2. The photodetection element according to claim 1, wherein the first high thermal conductivity layer is nonmagnetic.

3. The photodetection element according to claim 1, wherein the first high thermal conductivity layer is in contact with the first ferromagnetic layer.

4. The photodetection element according to claim 1, wherein the first high thermal conductivity layer is in contact with the first electrode.

5. The photodetection element according to claim 1, further comprising an insulating layer,
wherein the insulating layer covers at least a portion below a lower end of a second ferromagnetic layer side of the spacer layer within a sidewall of the magnetic element.

6. The photodetection element according to claim 1, wherein the first high thermal conductivity layer includes silicon carbide, aluminum nitride, or boron nitride.

7. The photodetection element according to claim 1, further comprising a high resistivity layer between the first high thermal conductivity layer and the second electrode,
wherein the high resistivity layer has higher resistivity than the first high thermal conductivity layer.

8. The photodetection element according to claim 1, further comprising a low dielectric constant layer between the first high thermal conductivity layer and the second electrode,
wherein the low dielectric constant layer has a lower dielectric constant than the first high thermal conductivity layer.

9. A receiving device comprising:
the photodetection element according to claim 1.

10. An optical sensor device comprising:
the photodetection element according to claim 1.

11. A photodetection element comprising:
a magnetic element including a first ferromagnetic layer to which light is applied, a second ferromagnetic layer, and a spacer layer sandwiched between the first ferromagnetic layer and the second ferromagnetic layer;
a first electrode in contact with a first surface of the magnetic element, the first surface being located on a first ferromagnetic layer side of the magnetic element in a lamination direction;
a second electrode in contact with a second surface of the magnetic element, the second surface being opposite to the first surface; and
a first high thermal conductivity layer disposed outside of the first ferromagnetic layer and having higher thermal conductivity than the first electrode; and
a second high thermal conductivity layer,
wherein the second high thermal conductivity layer is in contact with a sidewall of the first electrode, and
wherein the second high thermal conductivity layer has higher thermal conductivity than the first electrode.

12. The photodetection element according to claim 11, wherein the first high thermal conductivity layer is in contact with the second high thermal conductivity layer.

13. A photodetection element comprising:
a magnetic element including a first ferromagnetic layer to which light is applied, a second ferromagnetic layer, and a spacer layer sandwiched between the first ferromagnetic layer and the second ferromagnetic layer;
a first electrode in contact with a first surface of the magnetic element, the first surface being located on a first ferromagnetic layer side of the magnetic element in a lamination direction;
a second electrode in contact with a second surface of the magnetic element, the second surface being opposite to the first surface; and
a first high thermal conductivity layer disposed outside of the first ferromagnetic layer and having higher thermal conductivity than the first electrode,
wherein the first high thermal conductivity layer is a metal, and
wherein the first high thermal conductivity layer includes copper, gold, or silver.

14. A photodetection element comprising:
a magnetic element including a first ferromagnetic layer to which light is applied, a second ferromagnetic layer, and a spacer layer sandwiched between the first ferromagnetic layer and the second ferromagnetic layer;
a first electrode in contact with a first surface of the magnetic element, the first surface being located on a first ferromagnetic layer side of the magnetic element in a lamination direction;
a second electrode in contact with a second surface of the magnetic element, the second surface being opposite to the first surface; and
a first high thermal conductivity layer disposed outside of the first ferromagnetic layer and having higher thermal conductivity than the first electrode,
wherein the first high thermal conductivity layer is an insulator, and
wherein thermal conductivity of the first high thermal conductivity layer is greater than 40 W/m·K.

15. A photodetection element comprising:
a magnetic element including a first ferromagnetic layer to which light is applied, a second ferromagnetic layer, and a spacer layer sandwiched between the first ferromagnetic layer and the second ferromagnetic layer;
a first high thermal conductivity layer disposed outside of the first ferromagnetic layer and being a nonmagnetic metal; and
a insulating layer located between the first ferromagnetic layer and the first high thermal conductivity layer, wherein the first high thermal conductivity layer has higher thermal conductivity than the insulating layer, and wherein the first high thermal conductivity layer includes copper, gold, or silver.

16. A receiving device comprising:
the photodetection element according to claim 15.

17. An optical sensor device comprising:
the photodetection element according to claim 15.

* * * * *